United States Patent
Maekawa et al.

[11] Patent Number: 5,868,866
[45] Date of Patent: Feb. 9, 1999

[54] METHOD OF AND APPARATUS FOR CLEANING WORKPIECE

[75] Inventors: Toshiro Maekawa, Sagamihara; Koji Ono, Fujisawa; Manabu Tsujimura, Yokohama, all of Japan

[73] Assignee: Ebara Corporation, Tokyo, Japan

[21] Appl. No.: 609,686

[22] Filed: Mar. 1, 1996

[30] Foreign Application Priority Data

Mar. 3, 1995 [JP] Japan .................................. 7-070903

[51] Int. Cl.⁶ .................................................. B08B 3/02
[52] U.S. Cl. .................... 134/34; 134/1; 134/6; 134/26; 134/32; 134/36; 134/95.3; 134/153; 134/100.1; 134/902; 15/77; 15/88.2; 15/88.3; 15/97.1; 15/102
[58] Field of Search ............... 134/1, 6, 26, 32, 134/34, 36, 95.3, 153, 100.1, 902; 15/77, 88.2, 88.3, 97.1, 102

[56] References Cited

U.S. PATENT DOCUMENTS

| | | | |
|---|---|---|---|
| 4,064,885 | 12/1977 | Dussault et al. | 134/58 R |
| 4,092,176 | 5/1978 | Kozai et al. | 134/186 |
| 4,326,553 | 4/1982 | Hall | 134/153 |
| 4,389,071 | 6/1983 | Johnson, Jr. et al. | 134/1 |
| 4,476,601 | 10/1984 | Oka | 15/77 |
| 4,501,285 | 2/1985 | Irwin | 134/58 R |
| 4,962,776 | 10/1990 | Liu et al. | 134/11 |
| 5,100,476 | 3/1992 | Mase et al. | 134/1 |
| 5,144,711 | 9/1992 | Gill, Jr. | 15/77 |
| 5,316,591 | 5/1994 | Chao et al. | 134/34 |
| 5,326,035 | 7/1994 | Ohmi et al. | 134/902 |
| 5,345,639 | 9/1994 | Tanoue et al. | 15/88.2 |
| 5,351,360 | 10/1994 | Suzuki et al. | 134/902 |
| 5,361,449 | 11/1994 | Akimoto | 134/153 |
| 5,375,291 | 12/1994 | Tateyama et al. | 134/153 |
| 5,476,414 | 12/1995 | Hirose et al. | 451/288 |
| 5,485,644 | 1/1996 | Shinbara et al. | 15/88.2 |
| 5,498,294 | 3/1996 | Matsushita et al. | 134/6 |
| 5,518,552 | 5/1996 | Tanoue et al. | 134/1 |
| 5,551,986 | 9/1996 | Jain | 134/6 |
| 5,562,778 | 10/1996 | Koretsky et al. | 134/34 |
| 5,581,837 | 12/1996 | Uchiyama et al. | 15/77 |
| 5,582,650 | 12/1996 | Simons | 134/1 |
| 5,616,069 | 4/1997 | Walker et al. | 134/153 |
| 5,727,332 | 3/1998 | Thresher et al. | 34/277 |

FOREIGN PATENT DOCUMENTS 2607479 2/1997 Japan .

*Primary Examiner*—Jill Warden
*Assistant Examiner*—S. Carrillo
*Attorney, Agent, or Firm*—Wenderoth, Lind & Ponack, L.L.P.

[57] ABSTRACT

A method of and an apparatus for cleaning a thin disk-shaped workpiece that is required to have a high degree of cleanliness, e.g., a semiconductor wafer, a glass substrate, a liquid crystal display, or the like. The method of cleaning the workpiece includes a plurality of cleaning steps, and comprises the steps of holding a workpiece, and performing a liquid jet cleaning of a surface of the workpiece in a first portion of plural cleaning steps. The method further comprises the step of performing a liquid jet cleaning of the surface of the workpiece in a latter portion of the plural cleaning steps.

18 Claims, 3 Drawing Sheets

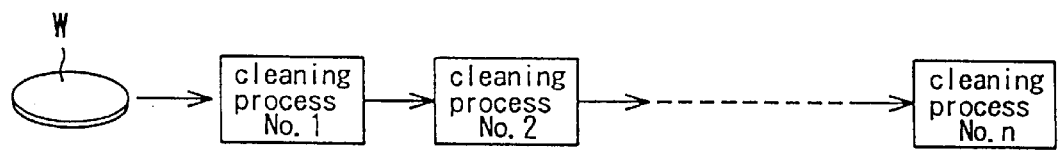
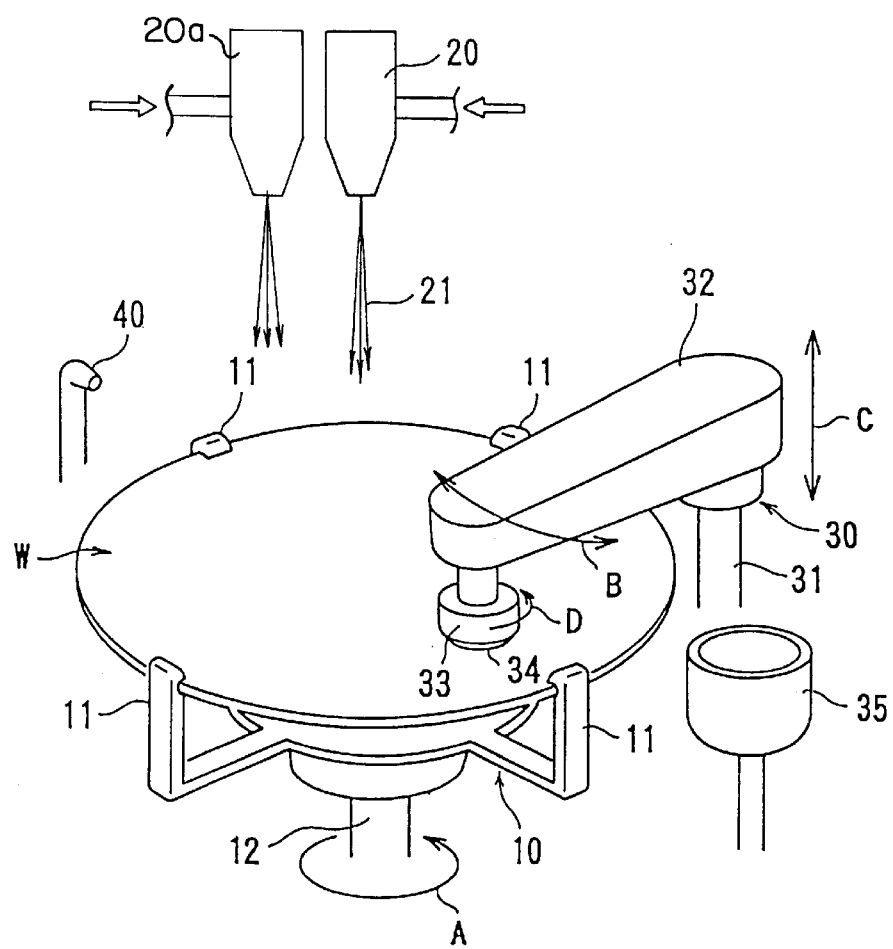

F I G. 6
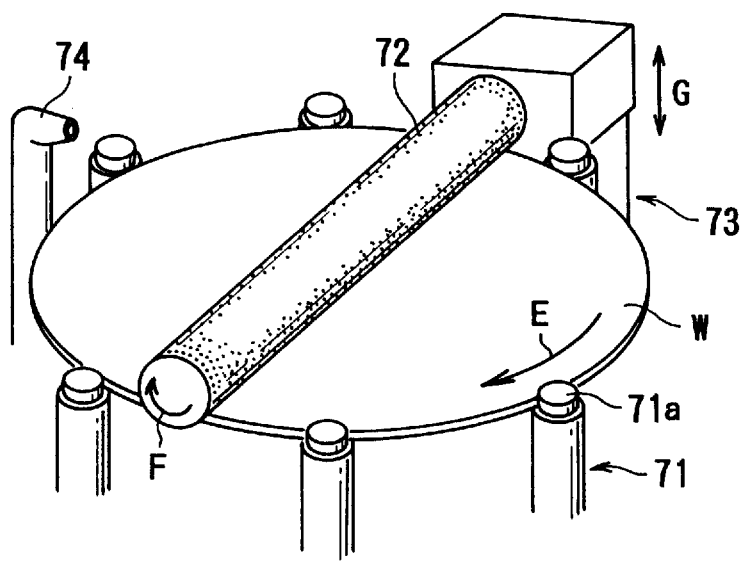

METHOD OF AND APPARATUS FOR CLEANING WORKPIECE

BACKGROUND OF THE INVENTION

1. Field of the Invention

The present invention relates to a method of and an apparatus for cleaning a workpiece, and more particularly to a method of and an apparatus for cleaning a workpiece that is required to have a high degree of cleanliness, e.g., a semiconductor wafer, a glass substrate, a liquid crystal display, or the like.

2. Description of the Prior Art

As semiconductor devices have become more highly integrated in recent years, circuit interconnections on semiconductor substrates have become finer and the distance between each circuit interconnections have become smaller. When semiconductor wafers are processed, small particles such as particles of semiconductor material, dust particles, crystalline protrusive particles, or the like often tend to be attached to the semiconductor wafers being processed. If a particle greater than the distance between interconnections exists on a semiconductor substrate, then the particle will short-circuit interconnections on the semiconductor substrate. Therefore, any undesirable particles on a semiconductor substrate have to be sufficiently smaller than the distance between interconnections on the semiconductor substrate. Such a problem and a requirement hold true for the processing of other workpieces including a glass substrate to be used as a mask, a liquid crystal display, and so on. To meet the above requirement, there have been practiced various cleaning procedures for removing fine particles or submicron particles from semiconductor wafers.

For example, heretofore one practice has been to use a brush of nylon, mohair or the like, or a sponge of polyvinyl alcohol (PVA) to scrub a surface of a semiconductor wafer. This process is called a scrubbing cleaning process. Further, there have been other practices, one of which is an ultrasonic cleaning process in which water having ultrasonic vibrational energy applied thereto is supplied to a surface of a semiconductor wafer, and another of which is a cavitation jet cleaning process in which high pressure water containing cavitation (i.e., cavitation bubbles) therein is supplied to a surface of a semiconductor wafer. Also, a cleaning process which combines two or three of the above processes is known in the art. A scrubbing cleaning process using a brush of nylon, mohair, or the like is effective to remove particles having diameters of 1 μm or larger from semiconductor wafers. However, such a scrubbing process fails to produce an appreciable cleaning effect on submicron particles smaller than such particle sizes, and adversely produces scratches over a surface of the semiconductor wafer. Further, when a number of semiconductor wafers are cleaned by the brush, particles are attached to the brush which in turn contaminates subsequent semiconductor wafers.

Particles having diameters of submicron size can be removed from semiconductor wafers by another scrubbing process sing a sponge of polyvinyl alcohol (PVA). The sponge of PVA has a tendency to entrap particles therein. This scrubbing process is, however, ineffective where a certain amount of particles are entrapped by the sponge. That is, the sponge of PVA does not have a long service life without suitable regeneration.

As described above, in case of a scrubbing cleaning process using a brush or a sponge, the brush or the sponge is contaminated during the cleaning process. Therefore, in the case where a semiconductor wafer to which a great number of particles are attached, as in the case of a semiconductor wafer which has been polished, is cleaned using the brush or the sponge, a brush or the sponge must be cleaned or replaced, resulting in imposing the serious burden on the operator.

Further, in case of cleaning a semiconductor wafer having a circuit pattern thereon, as particles are smaller and gaps into which particles are entered are smaller, the semiconductor wafer cannot be cleaned only by the scrubbing cleaning process.

On the other hand, an ultrasonic cleaning process and a cavitation jet cleaning process do not require cleaning by a brush or a sponge, and can remove some particles which cannot be removed by the scrubbing cleaning process.

Further, an ultrasonic cleaning process and a cavitation jet cleaning process are effective up to a degree of several ten or several hundred particles on a surface of a semiconductor wafer having a diameter of eight inches (200 mm).

However, in case of a semiconductor wafer which has been subjected to CMP (chemical mechanical polishing) process, the semiconductor wafer carries hundreds of thousands of particles. Thus, the ultrasonic cleaning process and the cavitation jet cleaning process are ineffective, because they can reduce the number of particles only to a degree of several thousands or several tens of thousands of particles.

SUMMARY OF THE INVENTION

It is therefore an object of the present invention to provide a method of and an apparatus for cleaning a workpiece 10 which has a cleaning member having a long service life, and can prolong a maintenance period and remove effectively fine particles which cannot be removed only by a scrubbing cleaning process.

According to the present invention, there is provided a method of cleaning a thin disk-shaped workpiece including a plurality of cleaning steps, comprising the steps of: holding a workpiece; and performing a liquid jet cleaning of a surface of the workpiece in the first portion of the plural cleaning steps.

According to the present invention, there is also provided such method of cleaning the workpiece, further comprising the step of performing a liquid jet cleaning of the surface of the workpiece in a latter portion of the plural cleaning steps.

According to one aspect of the present invention, the liquid jet cleaning comprises at least one of a water jet cleaning in which ultrapure water at a high pressure is ejected from a nozzle, a cavitation jet cleaning in which ultrapure water containing cavitation therein is ejected from a nuzzle, and an ultrasonic jet cleaning in which ultrapure water with ultrasonic vibrational energy is ejected from a nozzle.

According to the present invention, there is also provided an apparatus for cleaning a thin disk-shaped workpiece by performing a plurality of cleaning steps, such apparatus including a chuck for holding and rotating a workpiece; and at least one liquid jet nozzle for ejecting a liquid jet onto a surface of the workpiece; wherein the liquid jet ejected from the liquid jet nozzle performs a liquid jet cleaning of the surface of the workpiece in the first portion of plural cleaning steps.

According to the present invention, liquid jet cleaning in which a liquid jet ejected from a nozzle impinges on a surface of the workpiece is carried out at a primary stage of the cleaning processes. Even in a greatly contaminated semiconductor wafer, having a diameter of eight inches (200 mm), which carries on its surface hundreds of thousands of particles after a CMP process, since the liquid jet ejected from the nozzle is supplied to the semiconductor wafer at a first portion of the plural cleaning processes, the semiconductor wafer is not subjected to contamination during a cleaning process, unlike a scrubbing cleaning process which uses a brush or a sponge of PVA, and the number of particles on the semiconductor wafer can be reduced to a desired degree. Further, even after a scrubbing cleaning process, since a liquid jet cleaning process is carried out, submicron particles can be removed from the surface of the semiconductor wafer which has been subjected to at least a liquid jet cleaning and has a relatively clean surface.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1 is a block diagram showing cleaning processes for carrying out a cleaning method according to the present invention;

FIG. 2 is a perspective view of a cleaning apparatus according to the present invention;

FIG. 6 is a perspective view of a brush cleaning device according to the present invention.

DETAILED DESCRIPTION OF THE PREFERRED EMBODIMENTS

Figure 3:
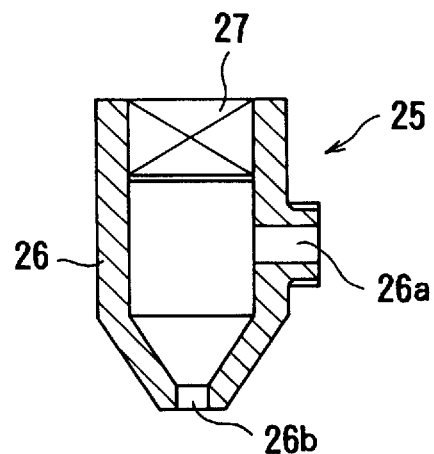
FIG. 3 is a cross-sectional view of a nozzle for ultrasonic cleaning according to the present invention.

A preferred embodiment of the present invention will be described below with reference to FIGS. 1 through 6.

FIG. 1 shows cleaning processes or steps for carrying out a cleaning method of the present invention. As shown in FIG. 1, a semiconductor wafer W which has been polished is subjected to a plurality of cleaning processes (steps) No. 1, No. 2, . . . No. n and cleaned to a high degree of cleanliness.

In a polishing process, a semiconductor wafer W is polished to a flat mirror finish while an abrasive liquid containing abrasive grains is supplied onto the semiconductor wafer W. Therefore, the semiconductor wafer W which has been polished carries on its surface abrasive grains contained in the abrasive liquid and ground-off particles of the semiconductor wafer, and is contaminated greatly. For example, in the case of a semiconductor wafer having a diameter of eight inches (200 mm), it carries hundreds of thousands of particles having diameters of 1 μm or greater after polishing.

In the case where a plurality of cleaning processes No. 1, No. 2, . . . No. n do not include a scrubbing cleaning process, a plurality of liquid jet cleaning processes which use liquid jets such as water jets are provided. A great number of particles on the semiconductor wafer is reduced to a certain degree by the liquid jet process in the first half of the cleaning processes, and the remaining particles are removed by the liquid jet process in the latter half of cleaning processes, thus obtaining a high degree of cleanliness of the semiconductor wafer.

To be more specific, for example, at least in the first cleaning process No. 1 and the final cleaning process No. n, liquid jet cleaning processes in which liquid such as water is ejected from a nozzle and impinges on a surface of a semiconductor wafer are carried out. The liquid jet cleaning process comprises one of a water jet cleaning process in which ultrapure water at a high pressure is ejected from a nozzle, a cavitation jet cleaning process in which ultrapure water containing cavitation therein is ejected from a nozzle, and an ultrasonic cleaning process in which ultrapure water having ultrasonic vibrational energy applied thereto is ejected from a nozzle. The above two or three cleaning processes may be combined.

Further, in a plurality of cleaning processes No. 1, No. 2, . . . No. n, in the case of carrying out a scrubbing cleaning process, a liquid jet cleaning process is provided before the scrubbing cleaning process. By such liquid jet cleaning process, a great number of particles on the semiconductor wafer is reduced to a certain degree, and thus contamination of a brush or a sponge used in the subsequent scrubbing cleaning process is reduced. In order to remove particles which have not been removed by the scrubbing cleaning process, a liquid jet cleaning process may be provided after the scrubbing cleaning process. In this case, although liquid jet cleaning processes may be provided before and after the scrubbing cleaning process, the latter liquid jet cleaning may use a liquid jet which imparts to the semiconductor wafer an impact force greater than that of the former liquid jet cleaning because the object of the latter liquid jet cleaning process is to remove particles which have not been removed by the former liquid jet cleaning process and the scrubbing cleaning process.

FIG. 2 shows a cleaning apparatus for carrying out a cleaning method according to the present invention. The cleaning apparatus comprises a spinning chuck 10 for holding a semiconductor wafer W and rotating the semiconductor wafer W in a horizontal plane at a predetermined speed, a liquid jet nozzle 20 for ejecting liquid 21 onto a surface of the semiconductor wafer W, and a scrubbing cleaning device 30 for scrubbing the surface of the semiconductor wafer W. The spinning chuck 10 has clamping members 11 for clamping the outer circumference of the semiconductor wafer W, and is rotatable about a shaft 12 in a direction of an arrow A.

The scrubbing cleaning device 30 comprises a shaft 31, an arm 32 supported by the shaft 31, and a sponge holder 33 provided at the forward end of the arm 32. The shaft 31 is vertically movable as shown by an arrow C, and the arm 32 is vertically movable with the shaft 31 and is swingable in a horizontal plane by rotation of the shaft 31 as shown by an arrow B.

A sponge 34 is mounted on the sponge holder 33. A cleaning cup 35 is provided adjacent to the spinning chuck 10 and contains pure water therein. When the scrubbing cleaning device 30 is not in operation, the sponge holder 33 holding the sponge 34 is placed in the cleaning cup 35. A nozzle 40 for rinsing the semiconductor wafer is provided adjacent to the spinning chuck 10.

With the above structure, the semiconductor wafer W is clamped by the clamping members 11 of the spinning chuck 10 with the surface to be cleaned of the semiconductor wafer W facing upwardly. In the first cleaning process, while the semiconductor wafer W is rotated in the direction of the arrow A by the spinning chuck 10, liquid 21 is ejected from the liquid jet nozzle 20 toward the upper surface of the semiconductor wafer W, thereby washing away particles such as abrasive grains and ground-off particles of the semiconductor wafer. In the second cleaning process, the arm 32 is lifted to take the sponge holder 33 holding the sponge 34 out of the cleaning cup 35 by lifting the shaft 31. The arm 32 is turned to move the sponge 34 to a position above the semiconductor wafer W. Thereafter, the arm 32 is lowered to press the sponge 34 against the upper surface of the semiconductor wafer W. The sponge holder 33 starts to rotate in the direction of an arrow D at a predetermined speed immediately before the sponge 34 contacts the semiconductor wafer W. At this time, the arm 32 is swung about the shaft 31, the spinning chuck 10 is rotated about the shaft 12, and the sponge 34 serves to scrub the upper surface of the semiconductor wafer W. Further, rinsing liquid such as ultrapure water is supplied from the nozzle 40 onto the upper surface of the semiconductor wafer W to wash away abrasive grains and ground-off particles of the semiconductor wafer.

In the second cleaning process of the scrubbing cleaning process, when the semiconductor wafer W and the sponge 34 are pressed against each other and moved relatively to each other, particles on the semiconductor wafer W are scraped off by edges of recesses or micropores of the sponge 34, are trapped in the recesses or the micropores, and thus are removed from the semiconductor wafer W. In case of scrubbing the polished semiconductor wafer W with a high degree of contamination by the sponge 34, since the sponge 34 cannot be sufficiently purified in a short time by self-cleaning achieved by soaking the sponge 34 in ultrapure water in the cleaning cup 35, there is a high possibility that the sponge 34 contaminates adversely the semiconductor wafer W.

However, contamination of the sponge 34 can be suppressed to a minimum degree by reducing the number of particles in the first cleaning process comprising the liquid jet cleaning process and by the self-cleaning which is carried out by soaking the sponge 34 in ultrapure water in the cleaning cup 35.

The number of particles on the semiconductor wafer W is reduced to the range of tens of thousands to thousands in the first cleaning process, and the number of particles having diameters of 1 $\mu$m or greater is reduced to several tens in the scrubbing cleaning process using the sponge 34.

In the third cleaning process, the scrubbing cleaning device 30 is stopped, the sponge holder 33 holding the sponge 34 is placed in the cleaning cup 35, and liquid 21 is ejected from the liquid jet nozzle 20 toward the upper surface of the semiconductor wafer W, thereby washing away particles, including abrasive grains and ground-off particles of the semiconductor wafer, which have not been removed by the scrubbing cleaning process.

Recent smaller wiring patterns or interconnections demand a semiconductor wafer having a high degree of cleanliness, and hence the number of particles having diameters of 0.2 $\mu$m or greater is required to be not more than ten in a semiconductor wafer having a diameter of eight inches (200 mm). However, after the second cleaning process, the semiconductor wafer carries on its surface particles, having diameters of 0.2 $\mu$m or greater, whose number is in the range of several thousands to several hundreds. Therefore the cleaning processes up to the second cleaning process are not sufficient, and do not satisfy the demand of recent smaller wiring patterns or interconnections. Thus, the third cleaning process is required to satisfy the above demand.

After a series of the above cleaning processes, the spinning chuck 12 (see FIG. 2) is rotated at a high speed for thereby spin-drying the semiconductor wafer W, or $N_2$ (nitrogen) gas is blown over the semiconductor wafer W, and then the dried semiconductor wafer is discharged to the outside of the cleaning apparatus.

Liquid jet processes that may be employed for to the first and third cleaning processes are a water jet cleaning process in which ultrapure water at a high pressure is ejected from a nozzle, a cavitation jet cleaning process in which ultrapure water having cavitation therein is ejected from a nozzle, and an ultrasonic cleaning process in which ultrapure water having ultrasonic vibrational energy is ejected from a nozzle.

In the embodiment of FIG. 2, the first and third cleaning processes maybe carried out by the same liquid jet nozzle 20, however they may be carried out by different liquid jet nozzles, for example nozzles 20, 20a, and at different locations. In this case, the first and third cleaning processes may be carried out by different types of liquid jet processes. Further, even in the embodiment of FIG. 2, the state of liquid jets may be changed in the first and third cleaning processes by varying the pressure of liquid supplied to the nozzle.

Next, the structures of nozzles which supply various liquid jets will be described below.

FIG. 3 shows a nozzle 25 for ultrasonic cleaning. Nozzle 25 comprises a nozzle body 26 and an ultrasonic generator 27 provided in the nozzle body 26. When the ultrasonic generator 27 is energized and ultrapure water having a high pressure is supplied from an inlet 26a into the nozzle body 26, ultrasonic vibrational energy is imparted to the ultrapure water which is in turn ejected from a nozzle port 26b toward the upper surface of the semiconductor wafer W. The ultrasonic vibrational energy is imparted to the particles on the upper surface of the semiconductor wafer W from the ejected ultrapure water. As a result, the particles are vibrated, separated from the upper surface of the semiconductor wafer W, and washed away by the ultrapure water.

In the case where the ultrasonic cleaning process is employed in the first cleaning process of the embodiment of FIG. 2, although the semiconductor wafer has carried hundreds of thousands of particles after polishing, the number of particles having diameters of 1 $\mu$m or greater is reduced to the range of several tens of thousands to several thousands in the semiconductor wafer W having a diameter of eight inches (200 mm). The frequency of ultrasonic waves used in the ultrasonic cleaning process is in the range of 1.0 MHz to 1.5 MHz.

Figure 4:
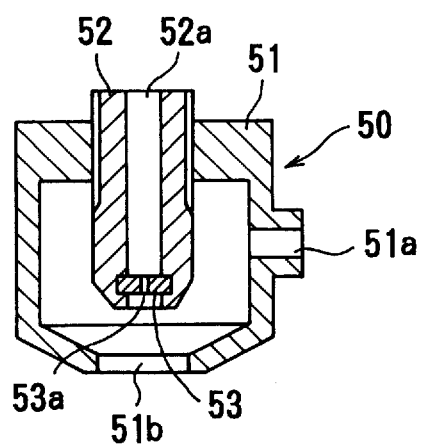
FIG. 4 is a cross-sectional view of a nozzle for cavitation jet cleaning according to the present invention.

FIG. 4 shows a nozzle for cavitation jet cleaning. Nozzle 50 comprises a low pressure nozzle 51 and a high pressure nozzle 52 whose forward end is inserted in the low pressure nozzle 51. The low pressure nozzle 51 has an inlet 51a for introducing a low pressure cleaning solution therethrough and a nozzle port 51b for ejecting a cleaning solution therefrom. The high pressure nozzle 52 has an inlet 52a for introducing a high pressure cleaning solution therethrough and a plate 53 provided at an outlet or forward end of the nozzle 52. A nozzle port 53a is formed at the central part of the plate 53.

In the nozzle 50 for cavitation jet cleaning thus constructed, a low pressure cleaning solution such as ultrapure water and a high pressure cleaning solution such as ultrapure water are simultaneously supplied from the respective inlets 51a and 52a, and a low speed jet is ejected from the nozzle port 51b and a high speed jet is ejected from the nozzle port 53a. The high speed jet ejected from the nozzle port 53a passes through the low speed jet ejected from the nozzle port 51b, and cavitation (i.e., cavitation bubbles) is generated at the boundary of two jets due to the speed difference between the high speed jet and the low speed jet.

By positioning the upper surface of the semiconductor wafer W at the location where the cavitation (i.e., cavitation bubbles) is broken, energy resulting from such breaking is imparted to the particles which are in turn separated from the upper surface of the semiconductor wafer W. For example, in FIG. 2, the nozzle 50 for cavitation jet cleaning is positioned at the location of the liquid jet nozzle 20, and the position of the nozzle 50 is adjusted such that the cavitation is broken at the upper surface of the semiconductor wafer W. Such cavitation jet cleaning produces an appreciable cleaning effect on submicron particles. In the case where this cavitation jet cleaning process is employed for the third cleaning process in the embodiment of FIG. 2, the number of particles having diameters of 0.2 $\mu$m or greater is reduced to several tens or less in the semiconductor wafer W having a diameter of eight inches (200 mm).

Figure 5:
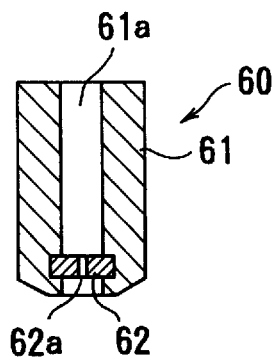
FIG. 5 is a cross-sectional view of a nozzle for high pressure jet cleaning according to the present invention.

FIG. 5 shows a nozzle 60 for a high pressure jet cleaning. Nozzle 60 comprises a nozzle body 61 having an inlet 61a and a plate 62 provided at the forward or outlet end of the nozzle body. A nozzle port 62a having a small inner diameter is formed at the central part of the plate 62.

In FIG. 2, the nozzle 60 for high pressure jet cleaning is positioned at the location of the liquid jet nozzle 20. High pressure cleaning solution such as ultrapure water is supplied from the inlet 61a, and the cleaning solution is throttled at the nozzle port 62a to become a high speed jet having a velocity of several tens of meters per second (m/s). This high speed cleaning solution impinges on the upper surface of the semiconductor wafer W, particles are separated from the upper surface of the semiconductor wafer W by the impact force, and the separated particles are washed away with the cleaning solution from the semiconductor wafer W.

FIG. 6 shows another scrubbing cleaning device comprising a brush cleaning device which is used for a cleaning process of the present invention. The brush cleaning device comprises a plurality of spindles 71 (six in the illustrated embodiment) for supporting the outer circumference of the semiconductor wafer W, a cylindrical brush 72 with bristles, a brush driving mechanism 73 for moving the brush 72 vertically as shown by an arrow G and rotating the brush 72 about its longitudinal axis as shown by an arrow F, and a rinsing nozzle 74 for supplying a rinsing solution such as ultrapure water onto the upper surface of the semiconductor wafer W.

In the brush cleaning device thus constructed, rollers 71a provided at the respective upper ends of the spindles 71 are pressed against the outer circumference of the semiconductor wafer W and rotated, thereby causing the semiconductor wafer W to rotate as shown by an arrow E. In this embodiment, two of the rollers 71a impart a rotating force to the semiconductor wafer W, and the remaining four rollers 71a serve as bearings to support the rotating semiconductor wafer W. The brush 72 is lowered to contact the upper surface of the semiconductor wafer W, a rinsing solution such as ultrapure water is supplied from a rinsing nozzle 74 toward the upper surface of the semiconductor wafer W, and the semiconductor wafer W and the brush 72 are rotated to effect the scrubbing cleaning of the semiconductor wafer W.

Before and after the scrubbing cleaning by the brush cleaning device in FIG. 6, one or more of the cleaning processes using the ultrasonic cleaning nozzle 25 in FIG. 3, the cavitation jet nozzle 50 in FIG. 4, and the high pressure jet nozzle 60 in FIG. 5 is carried out.

As described above, by providing a liquid jet cleaning process in a first portion of plural cleaning processes using the liquid jet nozzle 20 (see FIG. 2), the number of particles is reduced to a range of several tens of thousands to several thousands by the first liquid jet cleaning process in the semiconductor wafer W having a diameter of eight inches (200 mm). Thus, the contamination of the sponge or the brush used in the subsequent cleaning process is suppressed greatly, and frequency of necessary replacement of the sponge or the brush is greatly reduced to the order of approximately one-tenth of the conventional method. Further, by providing a liquid jet cleaning process in a latter portion of plural cleaning processes using the liquid jet nozzle 20, the number of particles having diameters of 0.2 $\mu$m or greater is reduced to ten or less in the semiconductor wafer having a diameter of eight inches (200 mm).

The present invention has been shown and described as being embodied for cleaning a semiconductor wafer. However, the principles of the present invention are also applicable to the cleaning of any of other workpieces that need to have a high degree of cleanliness, e.g., a semiconductor wafer, a glass substrate, a liquid crystal display, or the like. Further, the liquid jet nozzle 20 may eject pellets made of ice or dry ice for thereby performing a jet cleaning operation in which the pellets impinge on the workpiece.

The present invention offers the following advantages:

(1) It is possible to remove effectively minute particles or submicron particles from a workpiece such as a semiconductor wafer which has been contaminated greatly.

(2) It is possible to suppress contamination of a cleaning member such as a sponge or a brush used in an intermediate cleaning process to a minimum degree.

(3) It is possible to increase the service life of a cleaning member such as a sponge or a brush used in an intermediate cleaning process. That is, the number of times that the cleaning member must be replaced is reduced greatly.

Although certain preferred embodiments of the present invention has been shown and described in detail, it should be understood that various changes and modifications may be made therein without departing from the scope of the appended claims.

What is claimed is:

1. A method of cleaning a disk-shaped workpiece by performing thereon a plurality of cleaning steps, said method comprising:

performing a first cleaning step comprising ejecting from a nozzle onto a surface of said workpiece at least one first jet in the form of a cavitation jet of cleaning liquid having cavitation therein;

then performing a second cleaning step comprising contacting said surface with a cleaning member and thereby scrubbing said surface; and then performing a third cleaning step comprising ejecting from a nozzle onto said surface at least one second jet in the form of an ultrasonic jet of cleaning liquid having ultrasonic vibrational energy.

2. A method as claimed in claim 1, comprising impacting said second jet onto said surface at a greater force than said first jet.

3. A method as claimed in claim 1, wherein said workpiece comprises a semiconductor substrate having said surface thereof polished.

4. A method as claimed in claim 3, wherein said semiconductor substrate has thereon circuit interconnections.

5. A method of cleaning a disk-shaped workpiece by performing thereon a plurality of cleaning steps, said method comprising:

performing a first cleaning step comprising ejecting from a nozzle onto a surface of said workpiece at least one first jet in the form of an ultrasonic jet of cleaning liquid having ultrasonic vibrational energy;

then performing a second cleaning step comprising contacting said surface with a cleaning member and thereby scrubbing said surface; and then performing a third cleaning step comprising ejecting from a nozzle onto said surface at least one second jet in the form of a cavitation jet of cleaning liquid having cavitation therein.

6. A method as claimed in claim 5, comprising impacting said second jet onto said surface at a greater force than said first jet.

7. A method as claimed in claim 5, wherein said workpiece comprises a semiconductor substrate having said surface thereof polished.

8. A method as claimed in claim 7, wherein said semiconductor substrate has thereon circuit interconnections.

9. An apparatus for cleaning a disk-shaped workpiece by performing thereon a plurality of cleaning steps, said apparatus comprising:

means for performing a first cleaning step by ejecting onto a surface of the workpiece at least one first jet in the form of a cavitation jet of cleaning liquid having cavitation therein;

cleaning member means operable to be brought into contact with the surface to thereby then perform a second cleaning step by scrubbing the surface; and means for then performing a third cleaning step by ejecting onto the thus scrubbed surface at least one second jet in the form of an ultrasonic jet of cleaning liquid having ultrasonic vibrational energy.

10. An apparatus as claimed in claim 9, wherein said means for performing said first cleaning step is operable to impact said first jet onto the surface at a first force, and said means for performing said third cleaning step is operable to impact said second jet onto the surface at a second force that is greater than said first force.

11. An apparatus as claimed in claim 9, wherein said means for performing said first cleaning step and said means for performing said third cleaning step comprise separate liquid jet nozzles.

12. An apparatus as claimed in claim 9, operable to perform said cleaning steps on a semiconductor substrate as the workpiece when the surface thereof is a polished surface.

13. An apparatus as claimed in claim 12, operable to perform said cleaning steps when the semiconductor substrate has circuit interconnections.

14. An apparatus for cleaning a disk-shaped workpiece by performing thereon a plurality of cleaning steps, said apparatus comprising:

means for performing a first cleaning step by ejecting onto a surface of the workpiece at least one first jet in the form of an ultrasonic jet of cleaning liquid having ultrasonic vibrational energy;

cleaning member means operable to be brought into contact with the surface to thereby then perform a second cleaning step by scrubbing the surface; and means for then performing a third cleaning step by ejecting onto the thus scrubbed surface at least one second jet in the form of a cavitation jet of cleaning liquid having cavitation therein.

15. An apparatus as claimed in claim 14, wherein said means for performing said first cleaning step is operable to impact said first jet onto the surface at a first force, and said means for performing said third cleaning step is operable to impact said second jet onto the surface at a second force that is greater than said first force.

16. An apparatus as claimed in claim 14, wherein said means for performing said first cleaning step and said means for performing said third cleaning step comprise separate liquid jet nozzles.

17. An apparatus as claimed in claim 14, operable to perform said cleaning steps on a semiconductor substrate as the workpiece when the surface thereof is a polished surface.

18. An apparatus as claimed in claim 17, operable to perform said cleaning steps when the semiconductor substrate has circuit interconnections.

* * * * *